United States Patent
Kamath et al.

(10) Patent No.: US 11,669,475 B2
(45) Date of Patent: Jun. 6, 2023

(54) ISOLATED UNIVERSAL SERIAL BUS REPEATER WITH HIGH SPEED CAPABILITY

(71) Applicant: Texas Instruments Incorporated, Dallas, TX (US)

(72) Inventors: Anant Shankar Kamath, Bangalore (IN); Rakesh Hariharan, Bangalore (IN); Mark Edward Wentroble, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 78 days.

(21) Appl. No.: 17/246,137

(22) Filed: Apr. 30, 2021

(65) Prior Publication Data
US 2022/0350766 A1    Nov. 3, 2022

(51) Int. Cl.
*G06F 13/38* (2006.01)
*H03K 5/24* (2006.01)
(Continued)

(52) U.S. Cl.
CPC ........ *G06F 13/385* (2013.01); *G06F 13/4072* (2013.01); *G06F 13/4221* (2013.01); *H03K 5/2472* (2013.01)

(58) Field of Classification Search
CPC .................................................. H03K 5/2472
See application file for complete search history.

(56) References Cited

U.S. PATENT DOCUMENTS 6,363,085 B1 * 3/2002 Samuels ............. G06F 13/4045
    370/242
7,587,536 B2 * 9/2009 McLeod ............. G06F 13/4045
    710/65
(Continued)

FOREIGN PATENT DOCUMENTS

WO    2016166539 A1    10/2016

OTHER PUBLICATIONS

"Universal Serial Bus Specification, Revision 2.0" (Compaq Computer Corporation, Hewlett-Packard Company, Intel Corporation, Lucent Technologies Inc, Microsoft Corporation, NEC Corporation, Koninklijke Philips Electronics N.V., Apr. 27, 2000), pp. i, ii, 119-170, 191-194.
(Continued)

Primary Examiner — Henry Tsai
Assistant Examiner — Aurangzeb Hassan
(74) Attorney, Agent, or Firm — Valerie M. Davis; Frank D. Cimino

(57) ABSTRACT

An isolating repeater and corresponding method for Universal Serial Bus (USB) communications. The isolating repeater includes, on either side of a galvanic isolation barrier, front end circuitry coupled to a pair of external terminals, a full speed (FS) transceiver adapted to drive and receive signals over one or more FS isolation channels, and a high speed (HS) transceiver adapted to drive signals over a one HS isolation channel and receive signals over another HS isolation channel. The front end circuitry encodes received signals corresponding to HS data into two-state signals for transmission over one HS isolation channel, and encodes received signals corresponding to HS signaling into two-state signals for transmission over one or more of the FS isolation channels. The front end circuitry on the other side of the isolation barrier decodes the two-state signals
(Continued)

received over the one or more FS isolation channels and the two-state signals received over the HS isolation channel for transmission at its external terminals.

21 Claims, 8 Drawing Sheets

(51) Int. Cl.
*G06F 13/42* (2006.01)
*G06F 13/40* (2006.01)

(56) References Cited

U.S. PATENT DOCUMENTS

| | | | |
|---|---|---|---|
| 10,958,454 B1* | 3/2021 | Chu | H04B 3/02 |
| 2012/0117294 A1* | 5/2012 | Jadus | G06F 13/4027 |
| | | | 710/315 |
| 2014/0089552 A1 | 3/2014 | Sala et al. | |
| 2014/0211862 A1* | 7/2014 | Moghe | H04B 5/005 |
| | | | 375/256 |
| 2016/0269126 A1* | 9/2016 | Maung | H04B 10/29 |
| 2016/0321210 A1 | 11/2016 | Baterina et al. | |
| 2019/0140747 A1 | 5/2019 | Maung et al. | |
| 2022/0018881 A1* | 1/2022 | Delshadpour | H04B 1/16 |

OTHER PUBLICATIONS

"ISO774x High-Speed, Robust-EMC Reinforced and Basic Quad-Channel Digital Isolators", Datasheet SLLSEP4G (Texas Instruments Incorporated, Feb. 2020).
"ADuM3160 Full/Low Speed 2.5 kV USB Digital Isolator" Datasheet, (Analog Devices, Inc., 2014).
"LTM 2884 Isolated USB Transceiver with Isolated Power" Datasheet (Analog Devices, Inc., Feb. 2020).
Patterson et al., "Operation of a Giant Magnetoresistive (GMR) Digital Isolator, Type IL510, Under Extreme Temperatures" (NASA Electronic Parts and Packaging Program, Sep. 2010).
International Search Report in corresponding PCT Patent Application No. PCT/US2022/027219, dated Aug. 9, 2022 (3 pages).

* cited by examiner

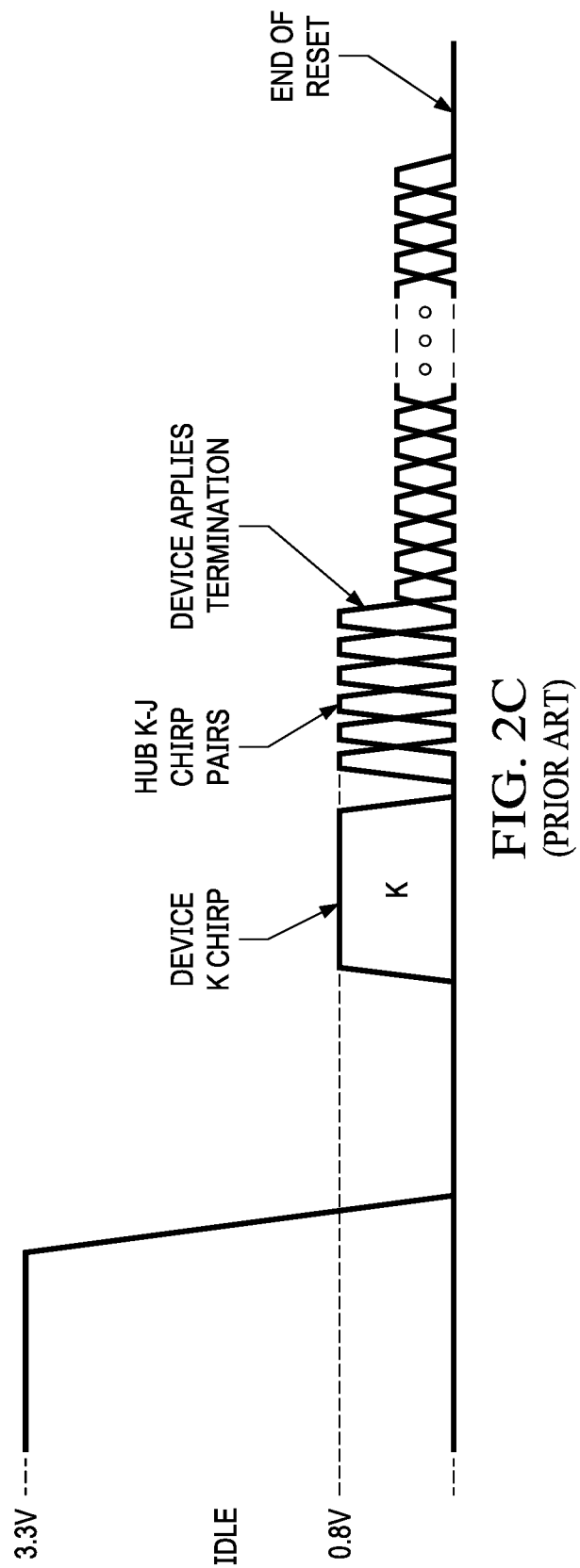

ISOLATED UNIVERSAL SERIAL BUS REPEATER WITH HIGH SPEED CAPABILITY

CROSS-REFERENCE TO RELATED APPLICATIONS

Not applicable.

BACKGROUND OF THE INVENTION

This relates to serial data communication, and is more specifically directed to galvanically isolated transceivers in serial data communication.

The technology of Universal Serial Bus (USB) communication among modern electronic devices and peripherals has become commonplace in recent years. As fundamental in this technology, USB communications are carried out according to industry standard specifications for cables and connectors, and for interface protocols over those cables and connectors. These protocols control the connection, communication, and power supply interfacing among computers (including smartphone handsets), peripherals, and other devices connecting to those computers. USB connections have been widely adopted over a wide variety of devices in recent years, and largely supplant other interconnection technologies for consumer and enterprise level devices.

One attractive attribute of USB communications technology is its ease of use, particularly the flexibility with which the use can interconnect USB peripherals to a host or to other devices, particularly via hubs and bus splitters. The USB network is essentially self-configuring, allowing the user to simply plug in or remove a device from an ad hoc USB network without configuring device settings, interrupts, I/O addresses, and the like. From the manufacturer's standpoint, the use of USB eliminates the need for the system designer to develop proprietary interfaces to later-developed peripheral devices, or to implement interface hardware and software to maintain "legacy" compatibility.

Some applications present complications to USB interfacing, however, especially among devices that consume relatively high levels of power. In some situations, the system ground levels of devices connecting via USB are at different voltages, or the power consumption of one of the USB-connected devices can cause significant common mode transients. In these situations, galvanic isolation is desirable at the USB interface between the connecting devices. To that end, USB transceivers with isolated power, such transceivers also referred to as USB "repeaters," have been introduced. These devices provide a USB interface, such as at a bus splitter or hub, that includes an isolation barrier across which the repeater transceivers communicate according to the applicable USB standard.

By way of further background, USB standards provide for communication at a number of data rates, with each data rate class defined by protocols at the physical layer. Beginning with USB version 1.0, a "full-speed" (FS) USB data rate of 12 Mbps and a "low-speed" (LS) data rate of 1.5 Mbps have been defined. Later versions of the USB standards define a "high-speed" (HS) data rate of 480 Mbps. While the physical layer operating specifications and protocols for FS and LS communications are quite similar, the physical layer operating specifications and protocols for the HS data rate differ significantly from those for FS/LS communications.

BRIEF SUMMARY OF THE INVENTION

According to one aspect, an isolating repeater and corresponding method for Universal Serial Bus (USB) communications is provided. The isolating repeater includes, on either side of a galvanic isolation barrier, front end circuitry coupled to a pair of external terminals, a full speed (FS) transceiver adapted to drive and receive signals over one or more FS isolation channels, and a high speed (HS) transceiver adapted to drive signals over a one HS isolation channel and receive signals over another HS isolation channel. The front end circuitry encodes received signals corresponding to HS data into two-state signals for transmission over one HS isolation channel and encodes received signals corresponding to FS signaling into two-state signals for transmission over one or more of the FS isolation channels. The front end circuitry on the other side of the isolation barrier decodes the two-state signals received over the one or more FS isolation channels and the two-state signals received over the HS isolation channel for transmission at its external terminals.

Technical advantages enabled by one or more of these aspects include the construction and operation of an isolating repeater in a USB network to efficiently support multiple operating modes, for example including the high speed (HS) operating mode along with the full speed (FS) and low speed (LS) operating modes. Efficiency in the construction of the isolating repeater can be obtained in these implementations by using dedicated HS isolation channels for the communication of HS data, and using one or more FS/LS isolation channels for certain signaling in the HS operating mode. Reduction in the number of isolation channels across the galvanic isolation barrier in the isolating repeater reduces device cost and power consumption, and enables the HS isolation channels and transceivers to be designed for low jitter performance while the FS isolation channels and transceivers can be designed for low power consumption.

Other technical advantages enabled by the disclosed aspects will be apparent to those of ordinary skill in the art having reference to the following specification together with its drawings.

BRIEF DESCRIPTION OF THE SEVERAL VIEWS OF THE DRAWING

FIG. 2C is a timing diagram illustrating conventional handshaking operation establishing the HS operating mode in USB communications.

The same reference numbers or other reference designators are used in the drawings to designate the same or similar (functionally and/or structurally) features.

DETAILED DESCRIPTION OF THE INVENTION

The one or more embodiments described in this specification are implemented into a USB repeater supporting high-speed (HS), full-speed (FS), and low-speed (LS) communications across an isolation barrier, as it is contemplated that such implementation is particularly advantageous in that context. However, it is also contemplated that aspects of these embodiments may be beneficially applied in other applications. Accordingly, it is to be understood that the following description is provided by way of example only and is not intended to limit the true scope of the claims.

Figure 1:
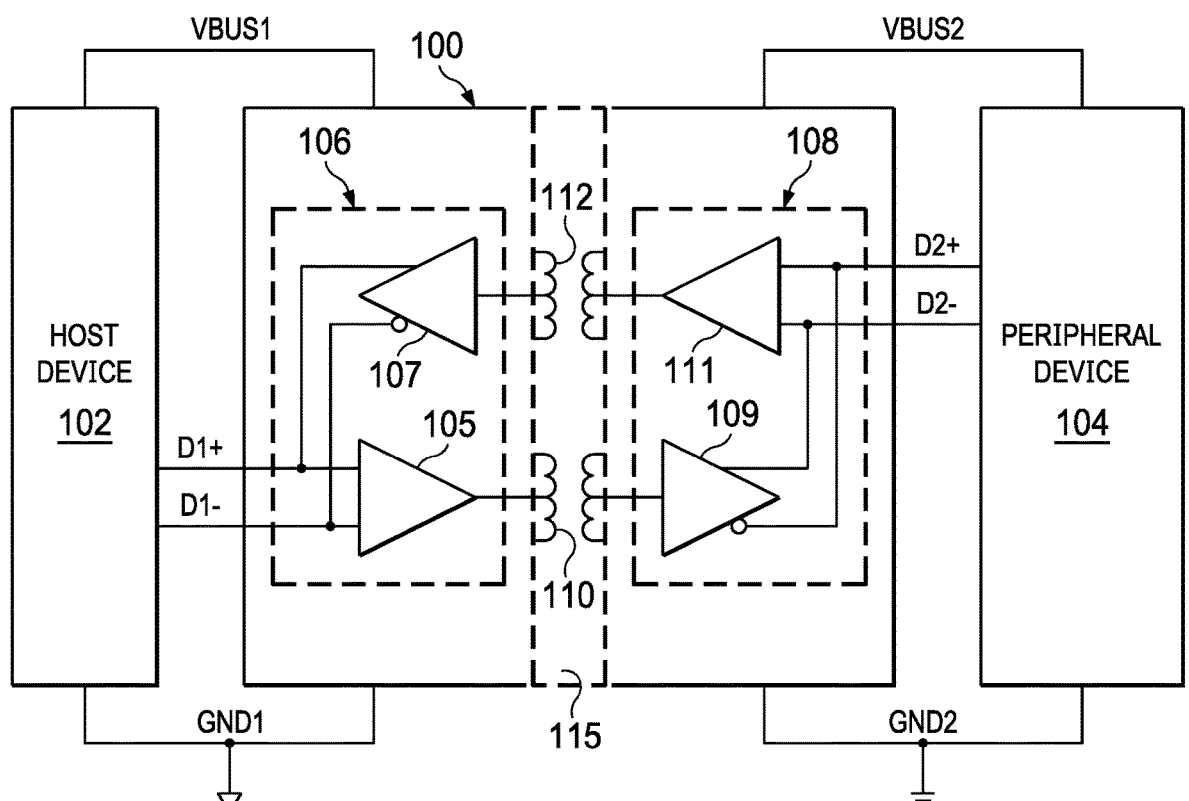
FIG. 1 is an electrical diagram, in block form, of a USB network including an isolating repeater in which one or more embodiments may be implemented.

FIG. 1 is a high level block diagram illustrating the function of isolating USB repeater 100 in a USB network in accordance with this specification. In this minimal system, host device 102 and peripheral device 104 carry out USB communications through isolating USB repeater 100. Repeater 100 may also be referred to as an "isolator," or "isolating repeater," such terms being interchangeable for purposes of this specification. According to USB standards, differential lines D1+, D1− in one USB cable connect host device 102 to repeater 100, and differential lines D2+, D2− in another USB cable connect repeater 100 to peripheral device 104. In this example, however, host device 102 is powered from a power supply voltage VBUS1 and a ground GND1 that differ from the power supply voltage VBUS2 and ground GND2, respectively, of peripheral device 104. The interface between host device 102 and peripheral device 104 is thus called on to provide galvanic isolation between the two devices to block large voltage differences, prevent ground loops, and block common mode transients between the different ground potentials.

USB isolating repeater 100 provides this galvanic isolation. As shown in FIG. 1, isolator 100 includes two transceivers 106, 108, with transceiver 106 coupled to differential lines D1+, D1−, and transceiver 108 coupled to differential lines D2+, D2−. In this example, transceiver 106 is biased by power supply voltage VBUS1 and ground GND1, along with host device 102, while transceiver 108 is biased by power supply voltage VBUS2 and ground GND2 of peripheral device 104. Transceiver 106 includes transmitter 105 and receiver 107, and transceiver 108 includes receiver 109 and transmitter 111. Transmitter 105 of transceiver 106 transmits (downstream) signals to receiver 109 of transceiver 108 via a coupled inductor pair (e.g., transformer) 110, while transmitter 111 of transceiver 108 transmits (upstream) signals to receiver 107 of transceiver 106 via coupled inductor pair 112. This inductive coupling (by coupled inductor pairs 110, 112) of signals between transceivers 106, 108 establishes a galvanic isolation barrier 115, providing the desired galvanic isolation between host device 102 and peripheral device 104.

As noted above, USB communications according to the operative standards (e.g., USB version 2.0 and higher) permit communications at various data rates, including the "full-speed" (FS) data rate of 12 Mbps, the "low-speed" (LS) data rate of 1.5 Mbps, and the "high-speed" (HS) data rate of 480 Mbps. According to the operative USB standards, both data transmission and control signaling are carried on the pair of differential signal lines (e.g., D1+, D1− of FIG. 1) in each of the FS, LS, and HS operating modes. Data transmission on the differential signal lines is communicated as differential "1" and differential "0" levels. For example, in the FS and LS operating modes, a differential "1" driven by host device 102 is indicated by its driving signal line D1+ above 2.8 V and signal line D1− under 0.3V, while a differential "0" is indicated by driving signal line D1− above 2.8 V and signal line D1+ under 0.3V. By way of shorthand, the differential "1" level is referred to as the "J" state and the differential "0" level is referred to as the "K" state. In the HS operating mode, a differential "1" (J) is indicated by a differential voltage of signal line D1+ relative to signal line D1− of greater than about +400 mV, and a differential "0" is indicated by this differential voltage less (more negative) than about −400 mV.

Figure 2A:
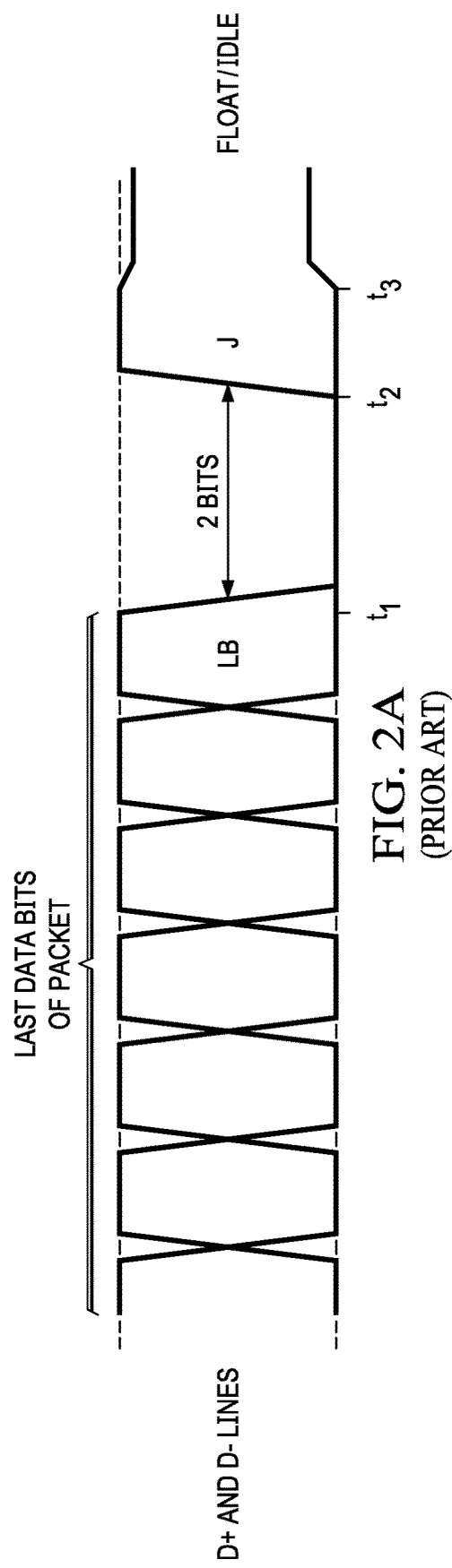
FIG. 2A is a timing diagram illustrating conventional transmission of data and an end-of-packet indicator in the FS operating mode for USB communications.

Control signaling includes the communication of operating states such as disconnected, idle, and the operating mode (e.g., FS or LS) of a device. Pull-up and pull-down resistors are provided at the interfaces of USB devices, including hubs and isolators, in order to detect these various states. Control signaling in USB on the pair of differential signal lines also indicates events such as reset, start-of-packet (SOP), end-of-packet (EOP), and the like. FIG. 2A illustrates an example of such control signaling in the FS operating mode, namely for signaling an end-of-packet (EOP) following the transmission of a packet of data bits. In FIG. 2A, the levels of the D+ and D− differential lines (e.g., D1+ and D1− in FIG. 1) make transitions at the FS data rate according to the last few data bits of the packet. At time t1 following the last bit of the packet (bit LB in FIG. 2A), the end-of-packet is indicated by the transmitting device pulling both the D+ and D− lines to a low level. The state of both D+ and D− at a low level is commonly referred to as a "single ended zero", or "SE0," condition. According to the USB standards, an end-of-packet is indicated by an SE0 for two bit periods, followed at time t2 by the transmitting device driving a J state (i.e., D− high and D+ low) for one bit period. On completion of the J bit at time t3, the transmitting device can float lines D+, D−, which enters the idle state. Signaling in the LS operating mode is similar to that in the FS operating mode.

Figure 2B:
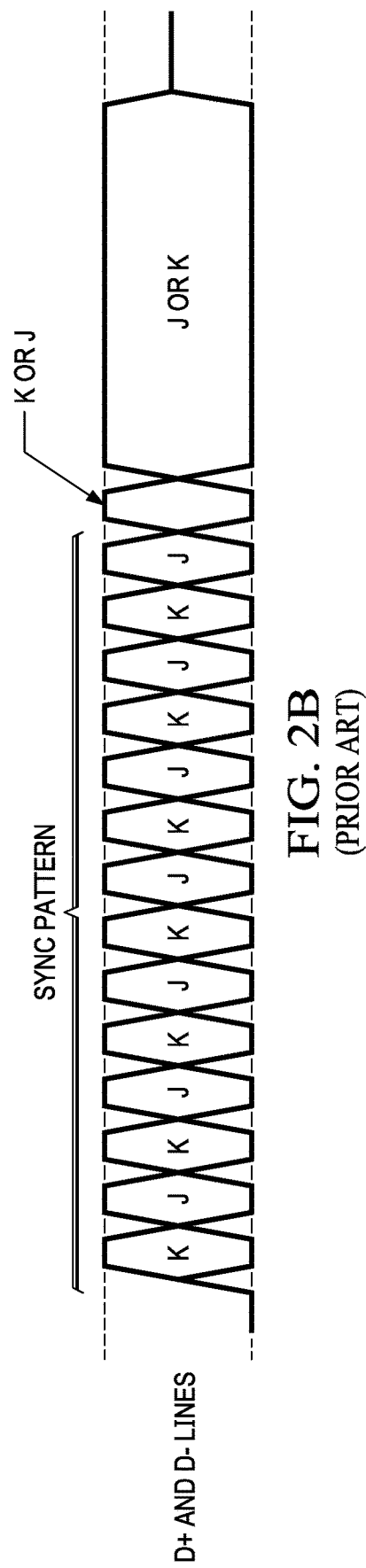
FIG. 2B is a timing diagram illustrating conventional transmission of a start-of-packet, data, and an end-of-packet indicator in the HS operating mode for USB communications.

FIG. 2B illustrates an example of control signaling according to the HS operating mode of USB standards. In the example of FIG. 2B, a start-of-packet (SOP) is indicated by the transmitting device driving a sequence of K-J state pairs (at the high HS data rate) following an idle state, which is indicated in the HS mode by an SE0 state with both data lines D+, D− at a low level (~0 differential). The sequence of K-J bit pairs amounts to a synchronization pattern, following which data bits can be transmitted. An end-of-packet (EOP) is indicated in the HS mode by an extended transmission of a data state opposite to that of the last data bit of the packet. As shown in FIG. 2B, a last data packet bit at the K or J state will mean that the EOP is indicated by an eight-bit sequence at the J or K state, respectively (e.g., EOP is indicated by an eight-bit duration of J following a last data bit at K). This eight-bit sequence at a single, opposite, state is a bit-stuffing error according to the USB standards, and thus can serve as an EOP indicator rather than as eight bits of data. Following the EOP indication, the transmitting device can then again enter the idle state.

As shown by way of example in FIGS. 2A and 2B, the communication of data bits and control signaling over the pair of differential lines in the various USB operating modes involves the transmission of not only the two differential states J and K, but also the third state of SE0 (both lines driven low). Two signal lines (e.g., differential signaling) is thus required to communicate these three states. However, the galvanic isolation that is to be provided by USB isolator 100 of FIG. 1 prohibits bidirectional communication on a given conductor. Rather, as described above, communication across galvanic barrier 115 involves separate signal paths, in this case via separate coupled inductor pairs 110, 112, for upstream and downstream communications. In actuality, therefore, four isolation "channels" across galvanic isolation barrier 115, two in each direction, are required to communicate the three states of J, K, and SE0 across isolation barrier 115.

As noted above, USB data transmission and signaling protocols are quite similar for the FS and LS operating modes. Accordingly, conventional repeaters and isolators are capable of supporting both the FS and LS operating modes over the same four isolation channels. Data transmission and signaling protocols in the HS operating mode are significantly different from those of the FS and LS operating modes, however. The different differential logic levels for the HS mode (e.g., nominally 400 mV) relative to the FS and LS modes (e.g., nominally 3.3 V) necessitate different terminations (e.g., pull-up and pull-down resistors at corresponding bias levels) for the HS and FS/LS modes. And as evident from FIGS. 2A and 2B, differences in the signaling protocols for the HS mode relative to FS/LS also exist, such as an EOP being indicated in FS/LS by an SE0 state while the SE0 state in the HS operating mode is the idle condition.

In addition, entry into the HS operating mode for a USB connection is carried out by way of a "handshake" sequence that is performed in the FS operating mode (i.e., at the slower data rate and higher differential logic levels). FIG. 2C illustrates an example of this "handshake" sequence by way of which the HS operating mode for USB communications is initiated between a host device and a connecting device. In this example, the handshake sequence is initiated by the connecting device indicating itself as a FS mode device by pulling up its D+ line to +3.3 V in the idle state, as shown in FIG. 2C. Availability of HS capability is indicated by the connecting device to the host by the connecting device presenting the SE0 condition by pulling down its D+ line for at least one millisecond, followed by a "chirp" at the K state for a specified time (e.g., between 1 and 7 msec). In response, the USB host supporting HS operation transmits an alternating sequence of K and J chirp pairs with no idle states, during which the connecting device switches its termination resistors to enable the lower differential signal levels of the HS operating mode. Reset into the HS operating mode can then complete on cessation of the K-J chirp pairs from the host device.

While it is desirable for an isolator such as repeater 100 of FIG. 1 to support HS operation in addition to FS and LS data rates, it has been observed that the differences in voltage levels, timing requirements, and signaling between the HS and FS/LS modes, as well as the manner in which entry into the HS operating mode is performed via handshaking entry at the higher voltages and lower rates of the FS mode, among other considerations, present significant barriers to the design and implementation of the HS mode as an available operating mode for USB isolators. Design of an isolator that supports both HS and FS/LS operation over the same isolation channels present difficult tradeoffs between the low jitter performance required for HS, on one hand, versus power consumption and isolation rating for FS/LS, on the other hand, resulting in suboptimal performance and perhaps requiring a retimer function in the HS signal path, which increases device cost. Conversely, while one could implement four separate isolation channels designed and dedicated for the HS operating mode, along with four separate isolation channels designed and dedicated for the FS/LS operating mode that are turned off when operating in the HS mode, each isolation channel is relatively expensive in terms of device area and power consumption. Providing eight isolation channels for a single isolator to support HS and FS/LS USB communication is thus an extremely expensive solution.

Figure 3:
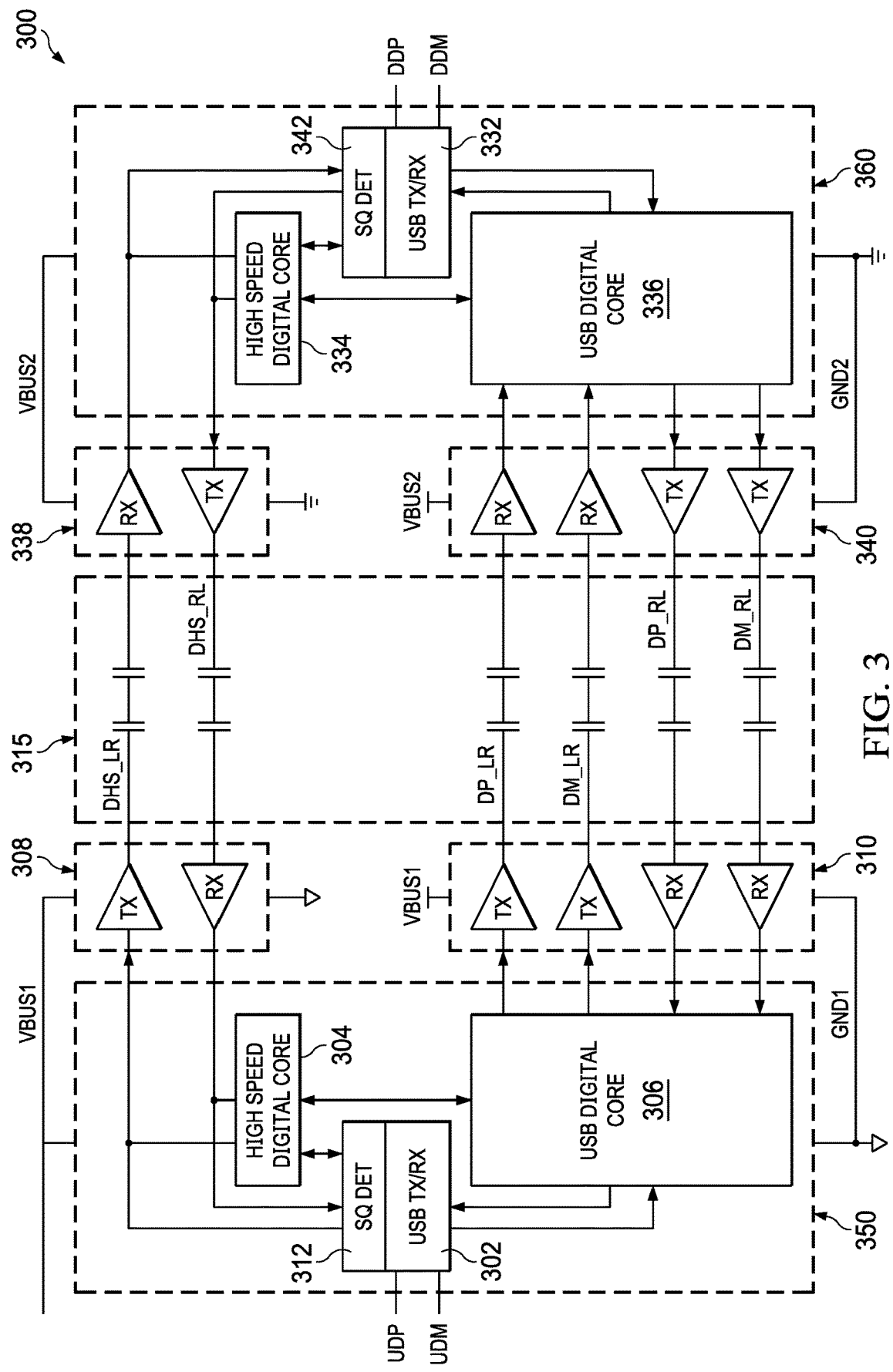
FIG. 3 is an electrical diagram, in block and schematic form, of an isolating repeater according to an embodiment.

FIG. 3 illustrates isolating USB repeater 300 according to one or more implementations. USB repeater 300 is constructed to use FS/LS isolation channels in combination with HS isolation channels in the HS operating mode, enabling efficient implementation of multiple USB modes with good isolation and high speed performance. According to the implementation of FIG. 3, repeater 300 has upstream USB differential input/outputs (I/Os) UDP, UDM for coupling to a USB host, and downstream USB differential I/Os DDP, DDM for coupling to a USB device, such as a peripheral device or other USB device providing a service or function to the USB host. Upstream I/Os UDP, UDM are coupled to USB transceiver 302, and downstream I/Os UDP, UDM are conversely coupled to USB transceiver 332. In practice, upstream and downstream side USB transceivers 302, 332 differ in the coupling and control of termination devices, such as pull-up and pull-down transistors, as specified for host and device connections in the various operating modes (LS, FS, HS) according to the operative USB standard. In addition, USB transceiver 302 includes squelch detector 312 that operates to detect the presence or absence of a signal at I/Os UDP, UDM. For example, squelch detector 312 may operate to detect whether the envelope of a differential signal has an amplitude greater than a threshold level (e.g., >150 mV), or below another threshold level (e.g., <100 mV), and issue control signals in response. As shown in the example of FIG. 3, one or more of these control signals from squelch detector 312 are forwarded to high speed digital core 304. In response to these squelch control signals, repeater 300 operates to ignore lower differential amplitudes at I/Os UDP, UDM as noise, and to consider higher differential amplitudes as signal. For example, a control signal from squelch detector 312 may operate to gate the transmission of signals by high speed digital core 304, such that high speed digital core 304 blocks the communication of signals received at I/Os UDP, UDM from communication over HS isolation channel DHS_LR in response to the differential signal envelope below the threshold level (e.g., in a "squelch" condition), and enables communication of signals over HS isolation channel DHS_LR in response to the differential signal envelope exceeding the threshold level (e.g., in a "no squelch" condition). USB transceiver 332 on the downstream side of repeater 300 similarly includes squelch detector 342, which detects the presence and absence of differential signals at I/Os DDP, DDM in the same manner, and gates the communication of signals over high speed isolation channel DHS_RL accordingly.

As shown in FIG. 3, the upstream side of repeater 300 includes high speed digital core 304 constructed of the appropriate digital logic for controlling the operation of the HS operating mode in the manner described below. High speed digital core 304 and USB transceiver 302 are both coupled to HS transmitter/receiver (transceiver) 308. HS transceiver 308 includes driver circuitry for transmitting single-ended signals over isolation channel DHS_LR to the downstream side of repeater 300, and receiver circuitry for receiving and detecting single-ended signals from the downstream side of repeater 300 over isolation channel DHS_RL. The upstream side of repeater 300 also includes USB digital core 306 that supports FS/LS USB communications and, as will be described in detail below, also supports signaling for the HS operating mode. USB digital core 306 is coupled to FS/LS transceiver 310 that includes driver circuitry for transmitting differential signals over a pair of isolation channels DP_LR and DM_LR ("P" and "M" indicating the + and − differential lines, respectively), and receiver circuitry for receiving and detecting differential signals from the downstream side of repeater 300 over isolation channels DP_RL and DM_RL.

Similarly as the upstream side, the downstream side of repeater 300 includes, in addition to USB transceiver 332, high speed digital core 334 coupled to HS transmitter/receiver 338 with driver and receiver circuitry for transmitting and receiving single-ended signals over isolation channels DHS_RL and DHS_LR, respectively. As such, HS transceivers 308 and 338 are in communication with one another over isolation channels DHS_LR, DHS_RL. The downstream side of repeater 300 also includes USB digital core 336 that supports FS/LS USB communications and signaling for the HS operating mode. USB digital core 336 is coupled to FS/LS transceiver 340 that includes driver circuitry for transmitting differential signals over the isolation channel pair DP_RL and DM_RL, and receiver circuitry for receiving and detecting differential signals from the upstream side of repeater 300 over isolation channels DP_LR and DM_LR.

According to this example embodiment, HS transceivers 308, 338 can be constructed to be well-suited for high data rate communication according to the USB HS operating mode, while FS/LS transceivers 310, 340 can be constructed to be suited for lower data rate communication according to the FS/LS operating modes. Stated another way, certain design tradeoffs can be made in the design and construction of each transceiver for its operating mode, without the compromises necessary to handle both HS and FS/LS operation. For example, the design of HS transceivers 308, 338 may favor low jitter performance at the expense of power consumption while the design of FS/LS transceivers 310, 340 may favor reduced power consumption while meeting the relaxed jitter specification of the lower data rate communications, in both cases ensuring maintaining a good galvanic isolation rating.

According to this implementation, repeater 300 thus provides a total of six isolation channels across isolation barrier 315: four isolation channels supporting FS and LS USB communications and two isolation channels dedicated to HS USB data communications, where one or more of the FS/LS isolation channels are used to support handshake establishment of an HS connection as well as HS signaling. More specifically, repeater 300 includes two FS/LS isolation channels DP_LR, DM_LR in the forward (downstream) direction for communicating FS/LS downstream data and also HS handshake signals; two FS/LS isolation channels DP_RL, DM_RL in the reverse (upstream) direction for communicating FS/LS downstream data and HS handshake signals; one HS isolation channel DHS_LR in the forward direction for communicating downstream HS data, and one HS isolation channel DHS_RL in the reverse direction for communicating upstream HS data. Isolation barrier 315 constitutes components, circuitry, or both, that electrically separate the circuitry on its opposing sides, in the sense that there are no DC connections between the two sides. This galvanic isolation established by isolation barrier 315 ensures that the circuitry on either side of isolation barrier receive separate power supply voltages and have separate ground levels from one another, and that any signals communicated across isolation barrier 315 are by way of AC or transducer coupling. As shown in FIG. 3, isolation barrier 315 may be implemented capacitively for each of the six isolation channels DHS_LR, DHS_RL, DP_LR, DM_LR, DP_RL, and DM_RL. In this example as shown in FIG. 3, isolation barrier 315 is implemented by way of a double capacitive insulation barrier. Isolation barrier 315 may alternatively be realized in other ways, including by way of inductive, optical, wireless, piezoelectric, Giant Magnetoresistive (GMR), or other isolation technologies. For example, each of the isolation channels may include a coupled inductor pair.

While not shown in FIG. 3, the power supply voltages and ground levels of the upstream and downstream sides of repeater 300 are separate from one another, for purposes of galvanic isolation. For example, the upstream side functions of transceiver 302, high speed digital core 304, and USB digital core 306, as well as HS transceiver 308 and FS/LS transceiver 310, may be biased from the same power supply node VBUS1 and ground node GND1. The downstream side functions of transceiver 332, high speed digital core 334, USB digital core 336, HS transceiver 338, and FS/LS transceiver 340 may be biased from power supply node VBUS2 and ground node GND2. Power supply node VBUS1 is isolated from power supply node VBUS2 by isolation barrier 315 and ground node GND1 is isolated from ground node GND2 by isolation barrier 315. Alternatively, the various upstream side functions may have different power supply voltages and ground levels among themselves, as may the downstream side functions but, in any case, ought to be maintained electrically separate from functions on the other side of isolation barrier 315.

In one implementation, the upstream side functions of transceiver 302, high speed digital core 304, and USB digital core 306 are implemented within the same integrated circuit, such as a USB "front end" integrated circuit 350, while the downstream side functions of transceiver 332, high speed digital core 334, and USB digital core 336 are implemented within USB front end integrated circuit 360; in this example, HS transceiver 308, FS/LS transceiver 310, HS transceiver 338, and FS/LS transceiver 340 are each implemented in a separate integrated circuit. Alternatively, the various digital logic and transceiver functions of repeater 300 may be implemented in fewer or more integrated circuits, depending on the desired implementation. Furthermore, parts or all of repeater 300 itself may be implemented within a larger scale integrated device, for example to isolate a USB port in a microcontroller-based system. It is to be understood that the particular implementation of repeater 300 in the implementation of FIG. 3 is not intended to be exclusive or limiting.

As described above, the signals used in the USB physical layer, such as are communicated to and from differential I/O pairs UDP/UDM and DDP/DDM, use the three states of differential "1", differential "0", and SE0 (both lines low). According to the implementation of FIG. 3, these three states as received on one I/O pair (e.g., UDP, UDM) are encoded for transmission as two-state signals over the appropriate isolation channels across isolation barrier 315, followed by decoding on the other side of galvanic barrier 315 and retransmission over the other I/O pair (e.g., DDP, DDM). In this example, the two-state signals transmitted over isolation channels in repeater 300 are encoded into the form of single-ended binary signals at one of a "0" logic level (logic low) or a "1" logic level (logic high). Alternatively, the two-state signals transmitted over the isolation channels in repeater 300 may be edge-based encoding in which each transition of the received signals at I/O pairs UDP/UDM or DDP/DDM is encoded for transmission over an isolation channel as a pulse indicating the polarity of the received transition. Another alternative form of two-state signal transmitted over the isolation channels in repeater 300 is referred to as "ON-OFF keying", in which the two states of the signal are represented by the presence of a carrier (e.g., representing a "1" state) or absence of the carrier (e.g., representing a "0" state). It is contemplated that repeater 300 according to this implementation may use any of these and similar two-state encodings in its transmission of signals over its isolation channels across isolation barrier 315.

As noted above, the USB physical layer signals communicated to and from differential I/O pairs UDP/UDM and DDP/DDM represent the three states of differential "1", differential "0", and SE0 (both lines low). Alternatively, it is contemplated that the external signals received and transmitted by repeater 300 may be in other forms or encodings, such as a combination of single-ended data signals representing three or more possible states or conditions, a tri-level single ended signal, or the like. For purposes of this description, the USB physical layer signals received at and transmitted from the I/Os of repeater 300 will be described as in the form of differential signals having the three available states of differential "1", differential "0", and SE0 (both lines low).

Figure 4:
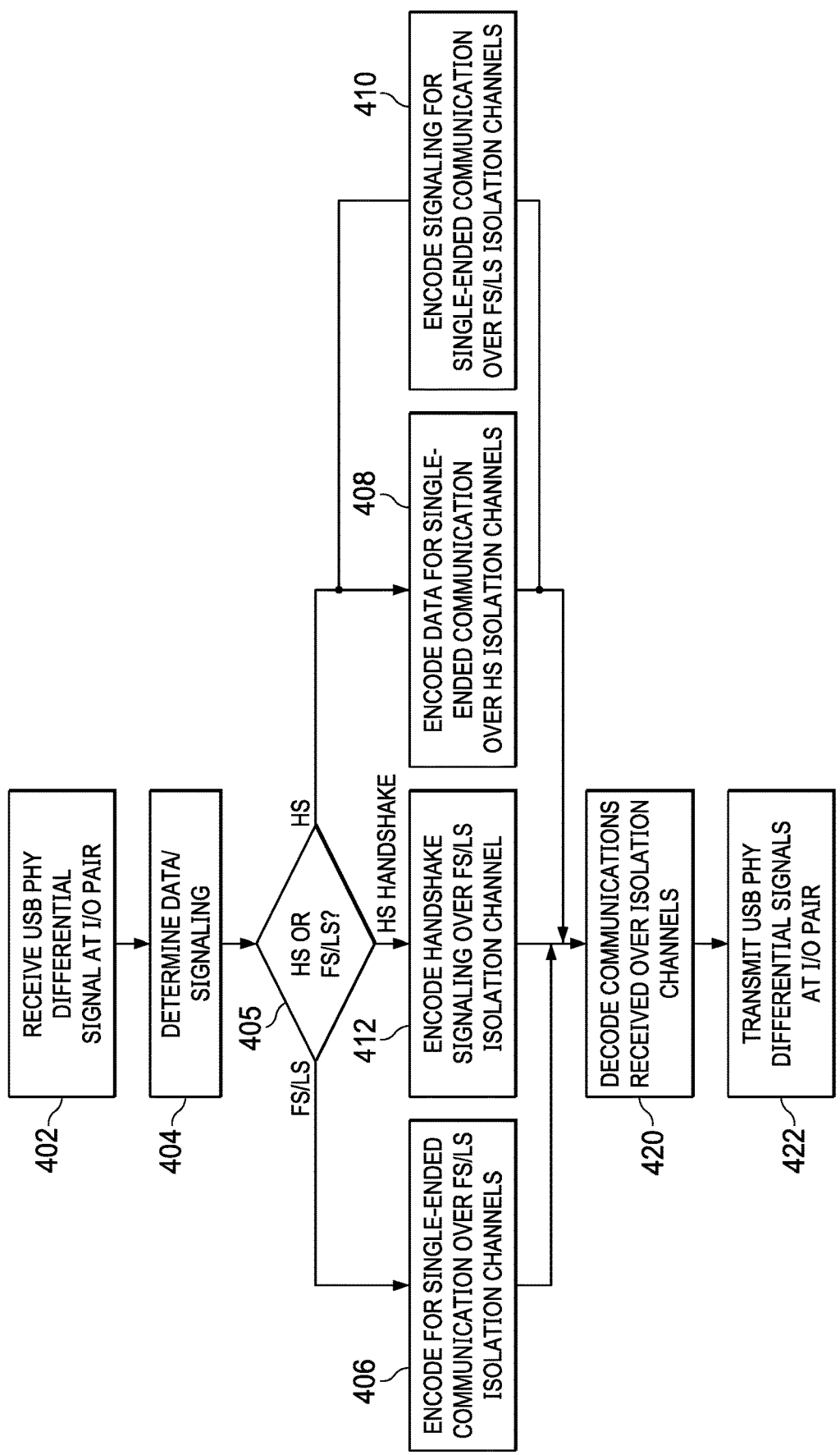
FIG. 4 is a flow chart illustrating an example of the operation of the isolating repeater of FIG. 3 according to an embodiment.

Referring to FIG. 4, the operation of repeater 300 in communicating USB signals between two USB devices, such as host device 102 and peripheral device 104 in the system of FIG. 1, while maintaining galvanic isolation between those devices according to an implementation will be described in a general sense. In process 402, repeater 300 receives a differential signal according to the applicable USB standard at one of its I/O pairs UDP, UDM or DDP, DDM.

The following example will be described for the case in which repeater 300 receives a differential signal from host device 102 at its upstream side I/Os UDP, UDM in process 402, it being understood that the operation of repeater 300 for signals received at downstream side I/Os DDP, DDM will follow a similar process. As described above, these signals received at I/Os UDP, UDM may include data or signaling applicable to one of the available USB operating modes (e.g., HS, FS, LS), and as such may be at any one of the applicable states of differential "1", differential "0", and SE0. These differential signals received in process 402 are processed by USB transceiver 302 in repeater 300, which detects in process 404 whether the received differential signals constitute data or signaling for the appropriate operation mode (HS, FS, LS) according to which repeater 300 is currently operating. In decision 405, USB transceiver 302 together with the logic circuitry of high speed digital core 304 and USB digital core 306, as the case may be, determines the appropriate action to be taken in repeater 300 to communicate the received USB differential signals across isolation barrier 315 to peripheral device 104.

If it is determined in decision 405 that the differential signal corresponds to data or signaling in one of the FS or LS operating modes, process 406 is performed by USB digital core 306 to encode the received differential signal into two-state signals for communication by FS/LS transceiver 310 across isolation barrier 315. If it is determined in decision 405 that the differential signal corresponds to data communication and signaling in the HS mode, process 408 is performed by HS digital core 304 to encode the received differential signal into two-state signals for communication by HS transceiver 308 across isolation barrier 315 via HS isolation channel DHS_LR, and process 410 is performed by USB digital core 306 to encode the signaling information (e.g., an SE0 condition indicating an EOP event) for communication by FS/LS transceiver 310 across isolation barrier 315 using one or more of FS/LS isolation channels DP_LR, DM_LR. If it is determined in decision 405 that the differential signal corresponds to a handshake sequence for switching from the FS to the HS operating mode, process 412 is performed by USB digital core 306 to encode the received differential signal into two-state signals for communication by FS/LS transceiver 310 across isolation barrier 315, so that the peripheral device 104 can respond appropriately prior to enabling the HS isolation channels DHS_LR, DHS_RL.

After the encoded signals are transmitted from HS transceiver 308 or FS/LS transceiver 310 across isolation barrier 315 and are received by corresponding HS transceiver 338 or FS/LS transceiver 340 on the downstream side of repeater 300, process 420 is performed by the appropriate one of HS digital core 334 or USB digital core 336 on the downstream side, in process 420. Following decoding process 420, the applicable digital core function controls USB transceiver 332 to transmit the corresponding differential signals at I/Os DDP, DDM to peripheral device 104, according to the applicable USB standard, in process 422. As a result, the USB signals transmitted by host device 102 are forwarded by repeater 300 to peripheral device 104 in such a way that isolation is maintained between the two devices.

Figure 5:
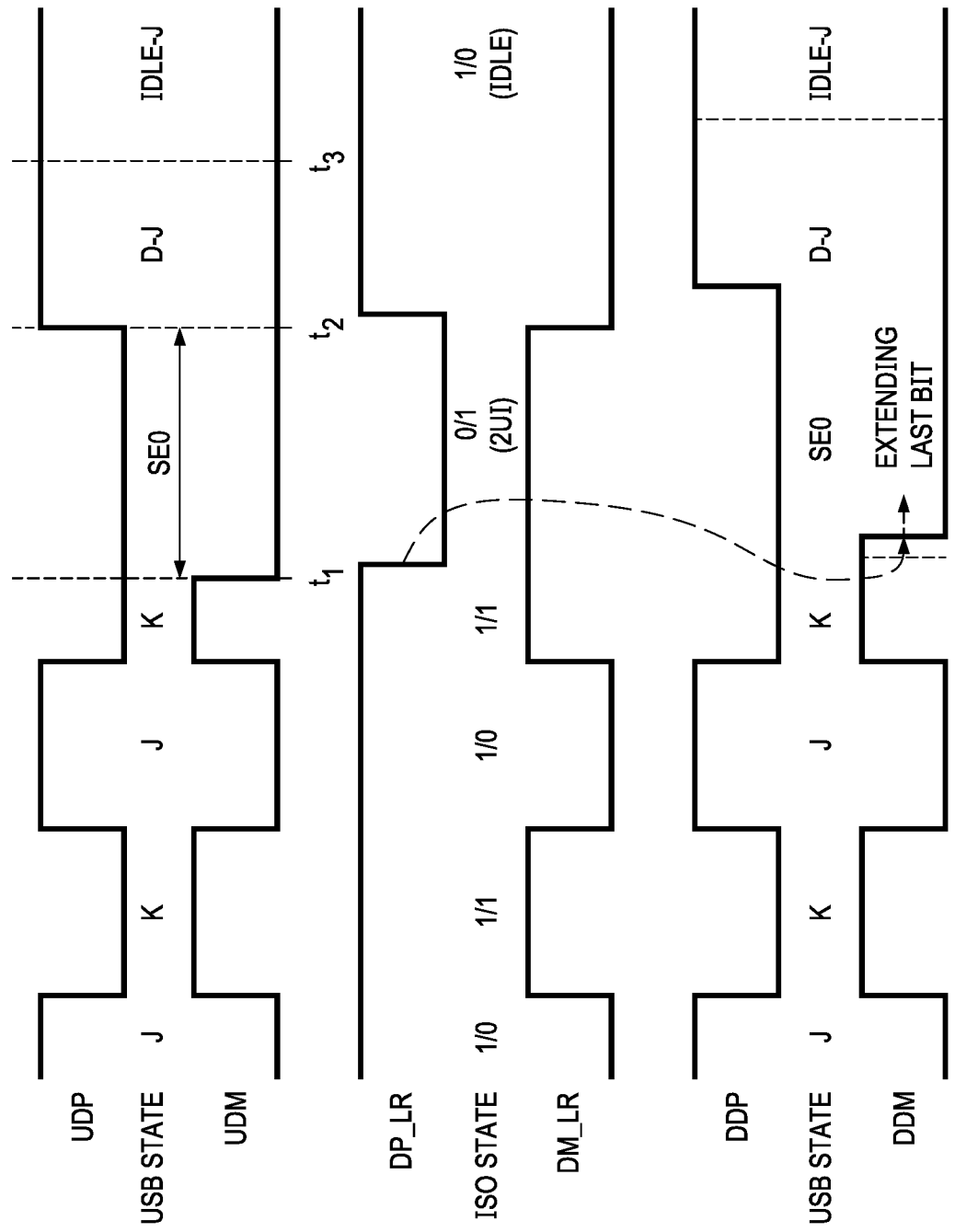
FIG. 5 is a timing diagram illustrating an example of transmission of data and an end-of-packet indicator in the FS operating mode in the isolating repeater of FIG. 3 according to an embodiment.

Referring now to FIG. 5, an example of the encoding and communication of two-state signals across isolation barrier 315 in the FS operating mode according to processes 406, 412, and 422 of FIG. 4 will now be described for the case of downstream FS data followed by an end-of-packet (EOP) In this example, one FS isolation channel (e.g., isolation channel DM_LR) is used for communicating data downstream across isolation barrier 315, while a combination of the two downstream FS isolation channels (e.g., isolation channels DP_LR and DM_LR) is used to indicate various signaling conditions. Also in this example, the two-state signals communicated over isolation channels DP_LR and DM_LR are in the form of single-ended logic signals, although other forms or encodings of two-state signals may alternatively be used as noted above. For purposes of this example of FIG. 5, the encoding of the received USB signals includes:

TABLE 1

| State/Data/Condition | Isolation channel signals |
| --- | --- |
| Idle state | DP/DM = 1/0 |
| Data traffic | DP = 1, DM=data state |
| SE0 | DP = 0, DM=last valid bit |
| End of SE0 | DP/DM = 1/0 |
| Reset | DP/DM = 0/1 |

In this Table 1, "DP" refers to either isolation channel DP_LR or DP_RL, and "DM" refers to either isolation channel DM_LR or DM_RL, depending on the direction of transmission. The initial four differential signals shown in FIG. 5 as received at inputs UDP, UDM correspond to a sequence of J and K states, namely J-K-J-K. According to the encoding of Table 1, these alternating J and K states are communicated by FS/LS transceiver 310 across isolation barrier 315 by driving its isolation channel DP_LR to a logic "1" level and driving isolation channel DM_LR according to the received logic state. FIG. 5 illustrates this encoding by isolation channel DP_LR at a high level in combination with isolation channel DM_LR alternating with the received J or K states (e.g., DM_LR at a logic "0" for a J state; DM_LR at a logic "1" for a K state). These encoded J and K states communicated across isolation barrier 315 and received by FS/LS transceiver 340 are then decoded by USB digital core 336 in process 420 and transmitted by USB transceiver 332 on I/Os DDP, DDM as corresponding J and K states in process 422, as evident from FIG. 5.

In this example, the second K state shown in FIG. 5 is the last valid bit of a packet, and as such is followed by an end-of-packet (EOP) indicator transmitted by host device 102. As described above relative to FIG. 2A, the USB standard for the FS/LS mode specifies that an EOP is indicated by an SE0 state for two bit periods followed by a J state for one period. As such, beginning at time t1 in FIG. 5, repeater 300 receives an SE0 in the form of low logic levels on both of I/Os UDP, UDM after the last valid (K) bit. According to the encoding of Table 1, USB digital core 306 encodes this SE0 state in process 406 as isolation channel DP_LR at a logic "0" and isolation DM_LR at a logic "1", and FS/LS transceiver 310 drives those isolation channels accordingly across isolation barrier 315 for receipt at FS/LS transceiver 340. USB digital core 338 decodes this state of isolation channels DP_LR, DM_LR as 0 and 1, respectively, as an SE0, and controls USB transceiver 332 to drive both I/Os DDP, DDM low, which forwards the SE0 condition to peripheral device 104 in this example. As shown in FIG. 5, the last valid bit in the K state is extended slightly by USB transceiver 332 on I/O DDM, to ensure reliable transmission of this last bit.

Following the SE0 state at I/Os UDP, UDM extending for two bit periods, host device 102 transmits a J state for one bit period, as shown beginning from time t2 in FIG. 5. This J state at I/Os UDP, UDM are encoded by USB digital core 304 as a J state (shown as "D-J" in FIG. 5) transmitted by FS/LS transceiver 310 as a logic "1" over isolation channel DP_LR and a logic "0" over isolation channel DM_LR. This state is decoded by USB digital core 340 on the downstream side of repeater 300 and is transmitted by USB transceiver 332 as a J state on I/Os DDP, DDM. The transition of I/O DDP to indicate the J state may be slightly delayed, given the extension of the last valid K bit following time t1 at I/O DDM. Following the USB standard, after the one bit period of the J state in the EOP indicator, I/Os UDP, UDM are floated into the idle state at time t3. This idle state is encoded onto isolation channels DP_LR, DM_LR according to the encoding of Table 1 by USB transceiver 310 maintaining the I/O state beyond the one bit period, which in turn is decoded by USB digital core 336 on the downstream side of repeater 300 as entry into the idle state. USB digital core 336 then controls USB transceiver 332 to float its I/Os DDP, DDM, indicating the idle condition following the EOP indicator to peripheral device 104.

Additional states in the FS/LS operating modes that may be encoded according to this implementation are summarized in the following Table 2. The L/R nomenclature in Table 2 assumes that the left side of repeater 300 is upstream (e.g., toward host device 102) and the right side is downstream (e.g., toward peripheral device 104), as shown in FIG. 3.

TABLE 2

| State | UDP/UDM | DP/DM_LR | DHS_LR | DP/DM_RL | DHS_RL | DDP/DDM |
|---|---|---|---|---|---|---|
| Power up | SE0 | 1/1 | N/A | 1/1 | N/A | SE0 |
| Connect DS | SE0 | 1/1 | N/A | J | N/A | J |
| Connect US | J | 1/0 | N/A | J | N/A | J |
| Reset | SE0 | 0/1 | N/A | 1/0 | N/A | SE0 |
| Disconnect | SE0 | X | N/A | 0/0 | N/A | SE0 |
| Suspend | J | 1/0 | N/A | 1/0 | N/A | J |
| Wake (at peripheral) | K | 0/0 | N/A | 1/1 | N/A | J to K transition |
| Resume (from host) | K | 1/1 | N/A | 1/0 | N/A | J to K transition |
| Host power-down | SE0 | 0/0 | N/A | X | N/A | X |

This encoding is provided by way of example only. Alternative encodings of the USB differential states according to the applicable standard into single-ended signal pairs for communication across isolation barrier 315 in repeater 300 are also contemplated. In any case, as evident from Table 2, isolation channels DHS_LR and DHS_RL are not used in the FS and LS operating modes.

Figure 6A:
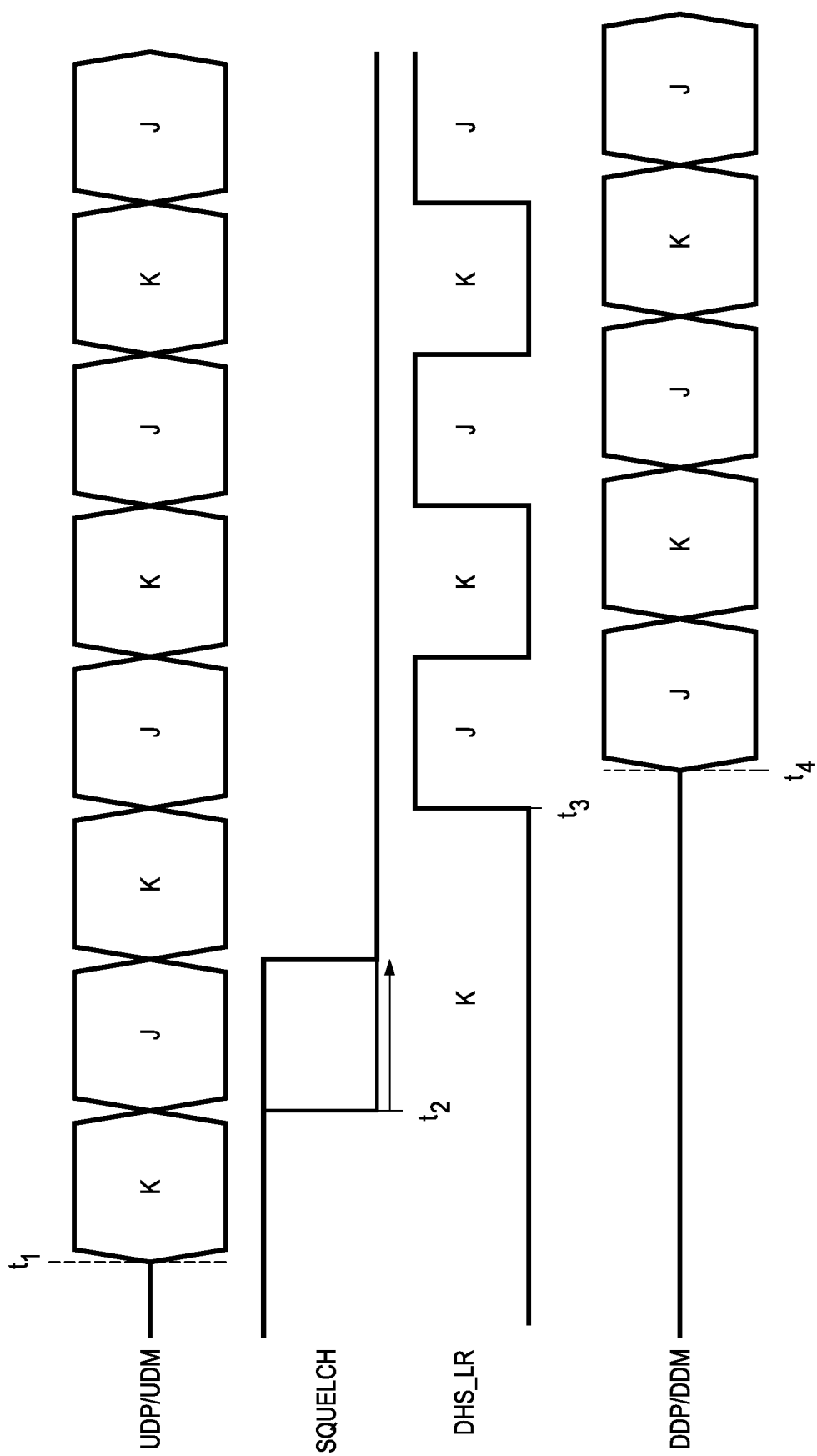
FIG. 6A is a timing diagram illustrating an example of transmission of a start-of-packet indicator and data in the HS operating mode in the isolating repeater of FIG. 3 according to an embodiment.

Referring now to FIG. 6A, an example of the encoding and communication of two-state signals across isolation barrier 315 in the HS operating mode according to processes 408, 412, and 422 of FIG. 4 will now be described for the case of downstream HS data beginning with a start-of-packet (SOP) indicator. In this example, the two-state signals communicated across isolation barrier 315 in the HS operating mode will be described as in the form of single-ended logic signals, although other forms or encodings of two-state signals may alternatively be used as noted above. As discussed above, the USB standard beginning with version 2.0 defines the SOP indicator for the HS operating mode as the transmitting device driving a sequence of K-J state pairs (at the high HS data rate) following an idle state which, for the USB HS mode, corresponds to an SE0 state with both data lines (e.g., I/Os UDP, UDM in FIG. 3) at a low level. Because the SE0 state is exhibited by a0 V differential at I/Os UDP, UDM, squelch detector 312 drives a "squelch" control signal to an active high level, in response to which high speed digital core 304 blocks HS transceiver 308 from transmitting signals over HS isolation channel DHS_LR. In the example of FIG. 6A, the first K state in this sequence of K-J pairs is initiated at time t1, and is received at I/Os UDP, UDM of repeater 300 in this downstream example. Squelch detector 312 in USB transceiver 302 detects a differential at I/Os UDP, UDM that has an envelope exceeding its threshold level (e.g., 150 mV) after at least one transition, and drives the squelch control signal to an inactive low level in response, at or after time t2 in FIG. 6A. In response to the inactive level of the squelch control signal (indicating the presence of a differential signal at I/Os UDP, UDM), high speed digital core 304 enables HS transceiver 308 to transmit signals over HS isolation channel DHS_LR corresponding to those received at I/Os UDP, UDM. During this time prior to the detection of a start-of-packet, and because repeater 300 is in the HS operating mode, the SE0 state at I/Os UDP, UDM is encoded by HS digital core 306 as a logic low level to appear on isolation channel DHS_LR, which corresponds to a K differential state (differential "0") at I/Os UDP, UDM. This logic low level on isolation channel DHS_LR is driven by HS transceiver 308 across isolation barrier 315 in process 408. The squelch control signal from squelch detector 312 is communicated to HS digital core 304, which in response enables HS transceiver 308 to communicate differential signal transitions over isolation channel DHS_LR. Because the first transition sensed by squelch detector 312 is the K-to-J transition (logic low to logic high) following the idle SE0 state, this K-to-J transition is driven by HS transceiver 308 onto isolation channel DHS_LR as a logic low to logic high transition at time t3. In response to the receipt of this first K-to-J transition and subsequent transitions on isolation channel DHS_LR by HS transceiver 338, HS digital core 334 on the downstream side of repeater 300 decodes these transitions as the start of a new packet in process 420, in response to which HS digital core 304 controls USB transceiver 332 to begin transmitting HS data at I/Os DDP, DDM to peripheral device 104 in process 422, as shown in FIG. 6A beginning at time t4. Data transmission in the HS operating mode of USB via repeater 300 then continues for one or more packets.

Figure 6B:
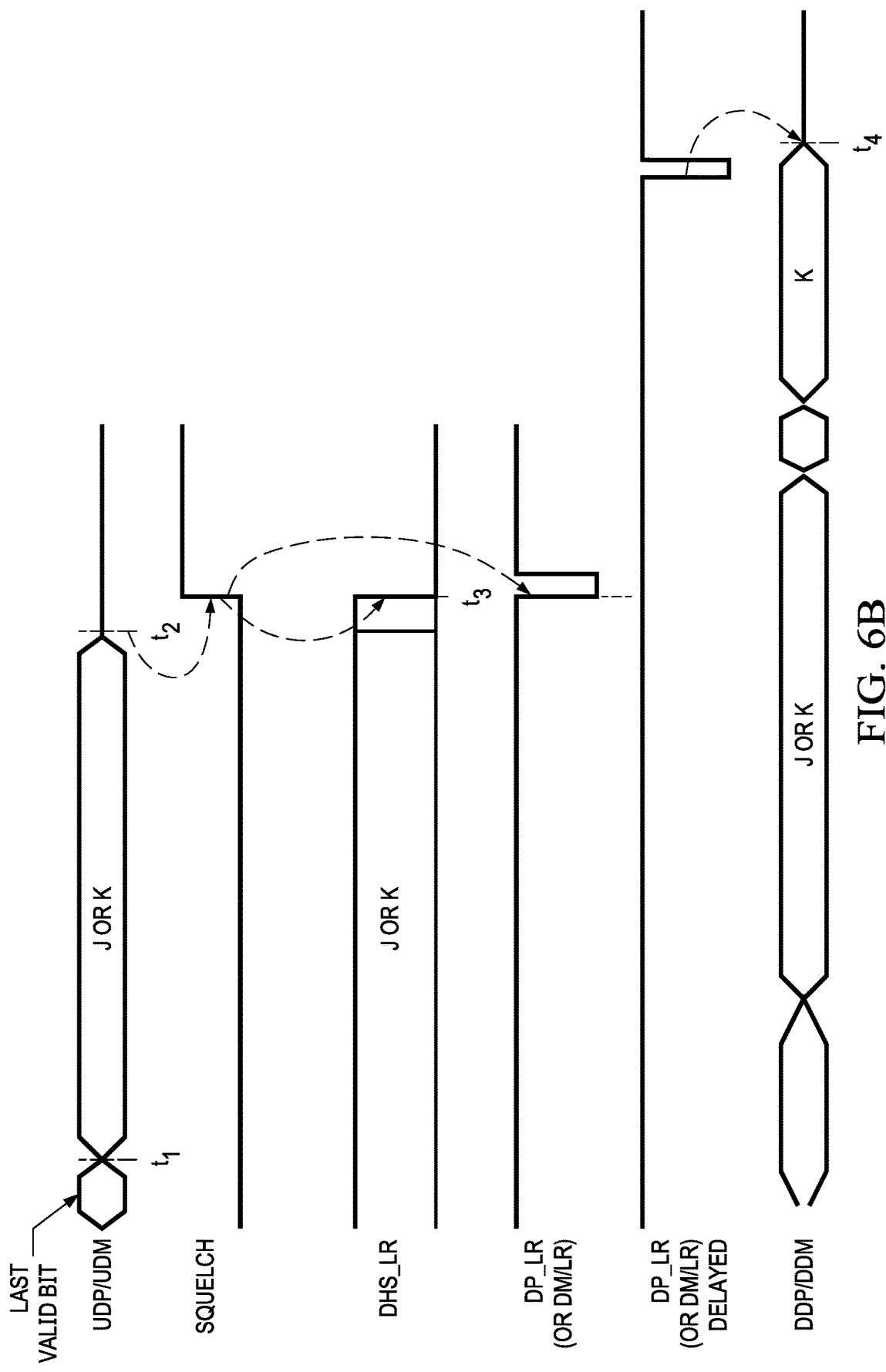
FIG. 6B is a timing diagram illustrating an example of transmission of data and an end-of-packet indicator in the HS operating mode in the isolating repeater of FIG. 3 according to an embodiment.

FIG. 6B illustrates an example of the operation of repeater 300 in the HS operating mode according to processes 408, 412, and 422 of FIG. 4 at the end of a packet of downstream HS data, including an end-of-packet (EOP) indicator. As described above, an end-of-packet (EOP) in the HS mode is indicated by an extended transmission of a data state opposite to that of the last data bit of the packet, followed by an SE0 state. That extended transmission, for example extending for eight bit periods, is a bit-stuffing error according to the USB standards, and can be interpreted as an EOP.

FIG. 6B illustrates the beginning of this extended transmission at the opposite state of the last valid transmitted bit as received at I/Os UDP, UDM beginning at time t1. At this time and during the extended opposite state transmission, squelch detector 312 continues to detect the presence of a signal at I/Os UDP, UDM, and as such maintains a "squelch" control signal at an inactive logic low level. Following the driving of an SE0 condition, host device 102 in this example places I/Os UDP, UDM at an SE0 condition, which occurs at time t2 in the example of FIG. 6B. Squelch detector 312 detects this SE0 condition at I/Os UDP, UDM as the absence of a differential signal, and issues an active "squelch" control signal in response. According to this example, the active squelch control signal is received by HS digital core 304 and is interpreted as an EOP indicator. In response to the active squelch control signal, HS digital core 304 controls HS transceiver 308 to block further transmission of data signals on isolation channel DHS_LR at time t3, leaving channel DHS_LR at a low logic level (i.e., the K state).

Because this K state at isolation channel DHS_LR could be interpreted at the downstream side of repeater 300 as part of a valid packet, one or more of the FS isolation channels (DP_LR, DM_LR) is used to communicate the EOP indicator according to this implementation. In this example, HS digital core 304 indicates the EOP condition indicated by the bit stuffing error of the extended opposite state transmission to USB digital core 306, which in turn controls FS/LS transceiver 310 to issue an EOP signal on one or more of FS/LS isolation channels DP_LR or DM_LR. In the example of FIG. 6B, the EOP signal conveyed across isolation barrier 315 is a short low-going pulse on one of FS/LS isolation channels DP_LR or DM_LR, occurring at time t3. Alternatively, the EOP signal may be conveyed as a particular encoding (e.g., pattern of bits). This pulse is decoded by USB digital core 336 on the downstream side of repeater 300 as an EOP in the HS operating mode, in response to which HS digital core 334 disables HS transceiver 338. Meanwhile, the HS data communicated across isolation barrier 315 has been forwarded by USB transceiver 332 onto I/Os DDP, DDM. Eventually a delayed version of the EOP pulse is generated by USB digital core 334, in response to which USB transceiver 332 places I/Os DDP, DDM into the SE0 condition at time t4, indicating to peripheral device 104 that the end of a packet has been reached.

Operation in the HS operating mode for the case of upstream transmission from peripheral device 104 to host device 102 will be encoded and communicated by repeater 300 across isolation barrier 315 in the same manner as described above relative to FIG. 6A and FIG. 6B, with the opposite isolation channels (e.g., DHS_RL rather than DHS_LR) and I/O designations.

Additional states in the HS operating mode that may be encoded according to this implementation are summarized in the following Table 2. Again, the L/R nomenclature in Table 2 assumes that the left side of repeater 300 is upstream (e.g., toward host device 102) and the right side is downstream (e.g., toward peripheral device 104), as shown in FIG. 3. This encoding is provided by way of example only, for purposes of description.

TABLE 3

| State | UDP/UDM | DP/DM_LR | DHS_LR | DP/DM_RL | DHS_RL | DDP/DDM |
|---|---|---|---|---|---|---|
| Reset | SE0 | 0/1 | N/A | 1/0 | N/A | SE0 |
| Device Chirp | Chirp-K | 0/1 | N/A | 1/1 | N/A | Chirp-K |
| Hub chirp | Chirp-K-J pattern | 1/1 = K 1/0 = J | N/A | 1/0 | N/A | Chirp K-J pattern |
| HS idle | SE0 | 1/0 | N/A | 1/0 | N/A | SE0 |
| HS disconnect | SE0 | 1/0 | N/A | 0/0 | N/A | SE0 |
| HS data signaling (US to DS) | HS Data | 1/0 | Data | 1/0 | N/A | HS Data |

TABLE 3-continued

| State | UDP/UDM | DP/DM_LR | DHS_LR | DP/DM_RL | DHS_RL | DDP/DDM |
|---|---|---|---|---|---|---|
| HS data signaling (DS to US) | HS Data | 1/0 | N/A | 1/0 | Data | HS Data |
| EOP (US to DS) | HS Data | 0/0 pulse | Data | 1/0 | 0 | HS Data |
| EOP (DS to US) | HS Data | 1/0 | Data | 0/0 pulse | 0 | HS Data |

Alternative encoding of the USB differential states according to the applicable standard into single-ended signal pairs for communication across isolation barrier 315 in repeater 300 are also contemplated.

Referring back to FIG. 4, handshake process 412 according to this implementation can be performed using one of the FS/LS isolation channels DP_LR and DM_LR, or DP_RL and DM_RL, as the case may be, because the signaling involved in the "chirp" signals involved in such handshaking is at the slower FS data rate and can be fully carried out in the FS operating mode. In this implementation, HS isolation channels DHS_LR and DHS_RL are enabled only upon completion of the handshaking process. The encoding of the handshake chirp signals for communication over FS/LS isolation channels DP_LR and DM_LR, or DP_RL and DM_RL according to this implementation is illustrated in Table 3. For example, to carry out handshaking process 412, peripheral device 104 can apply an SE0 state at terminals DDP, DDM in the idle state, followed by a chirp at the K state for the specified time, which are received by USB transceiver 332. In process 412, USB digital core 336 encodes the received SE0 state according to Table 2 and the received chirp-K according to Table 3, for transmission accordingly by FS/LS transceiver 340 across isolation barrier 315 over FS/LS isolation channels DP_RL, DM_RL. USB digital core 306 in turn decodes these two-state (e.g., single-ended) signals received by FS/LS transceiver 310 over isolation channels DP_RL, DM_RL in process 420, for transmission by USB transceiver 302 to host device 102 in process 422 as an SE0 state followed by the chirp-K via terminals UDP, UDM. The alternating K and J chirp pairs with no idle states then transmitted by host device 102 in response to the device chirp-K are received by USB transceiver 302 at terminals UDP, UDM (process 402), encoded by USB digital core 304 according to Table 3 for transmission by FS/LS transceiver 310 over FS/LS isolation channels DP_RL, DM_RL (process 412), received by FS/LS transceiver 340, and decoded by USB digital core 334 (process 420) for transmission as alternating K and J chirp pairs at terminals DDP, DDM (process 422). Peripheral device 104 eventually switches its termination resistors to enable the lower differential signal levels of the HS operating mode, following which completion of reset into the HS operating mode by peripheral device 104 occurs on cessation of the K-J chirp pairs from the host device 102. At this point, HS digital core 306, 336 on either side of isolation barrier 300 enable HS transceivers 312, 342, respectively, for HS data communication over HS isolation channels DHS_LR, DHS_RL in the manner described above.

The implementations described above enable the construction and operation of an isolating repeater in a USB network to efficiently support multiple operating modes, for example including the high speed (HS) operating mode along with the full speed (FS) and low speed (LS) operating modes. Efficiency in the construction of the isolating repeater can be obtained in these implementations by using dedicated HS isolation channels for the communication of HS data, and using one or more FS/LS isolation channels for certain signaling in the HS operating mode. Reduction in the number of isolation channels across the galvanic isolation barrier in the isolating repeater not only can reduce device cost, but also can reduce the power consumption of the repeater in supporting these multiple modes.

Also according to these implementations, the design and construction of the transceivers driving and receiving signals across the isolation barrier need not be optimized for performance in all operating modes. In the example of repeater 300 described above, HS transceivers 308, 338 can be designed for high data rate communication according to the USB HS operating mode, for example to favor low jitter performance at the expense of power consumption, while FS/LS transceivers 310, 340 can be designed for lower data rate communication according to the FS/LS operating modes, for example to favor reduced power consumption while meeting the relaxed jitter specification of the lower data rate communications. In addition, according to these embodiments, high data rate USB communications can be efficiently carried out between electrically isolated host and peripheral devices over a range of operating modes, without compromise of important electrical parameters.

The term "couple", as used herein, may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronic or semiconductor component.

Unless otherwise stated, "about," "approximately," or "substantially" preceding a value means+/−10 percent of the stated value. Modifications are possible in the described examples, and other examples are possible within the scope of the claims.

While one or more embodiments have been described in this specification, it is of course contemplated that modifications of, and alternatives to, these embodiments, such modifications and alternatives capable of obtaining one or more the advantages and benefits of this invention, will be apparent to those of ordinary skill in the art having reference to this specification and its drawings. It is contemplated that such modifications and alternatives are within the scope of the claims presented herein.

What is claimed is:

1. An isolating repeater for Universal Serial Bus (USB) communications, comprising:
    first front end circuitry coupled to a first pair of terminals;
    second front end circuitry coupled to a second pair of terminals;
    a first full speed (FS) transceiver coupled to the first front end circuitry and adapted to drive and receive signals over one or more FS isolation channels;
    a second FS transceiver coupled to the second front end circuitry and adapted to drive and receive signals to and from the first FS transceiver over the one or more FS isolation channels, the first and second FS transceivers galvanically isolated from one another;
    a first high speed (HS) transceiver coupled to the first front end circuitry and adapted to drive only HS data signals over a first HS isolation channel and receive only the HS data signals over a second HS isolation channel; and
    a second HS transceiver coupled to the second front end circuitry and adapted to drive only the HS data signals to the first HS transceiver over the second HS isolation channel and receive only the HS data signals from the first HS transceiver over the first HS isolation channel, the first and second HS transceivers galvanically isolated from one another;
    wherein the first front end circuitry is adapted to encode signals received at the first pair of terminals and corresponding to HS data into two-state signals transmitted by the first HS transceiver over the first HS isolation channel;
    wherein the first front end circuitry is adapted to encode signals received at the first pair of terminals and corresponding to HS signaling into two-state signals transmitted by the first FS transceiver over one or more of the FS isolation channels;
    and wherein the second front end circuitry is adapted to decode two-state signals received by the second FS transceiver from the first FS transceiver over the one or more FS isolation channels and from the first HS transceiver over the first HS isolation channel for transmission as signals at the second pair of terminals.

2. The repeater of claim 1, wherein the first front end circuitry is adapted to encode signals received at the first pair of terminals and corresponding to FS data and signaling into two-state signals transmitted by the first FS transceiver over one or more of the FS isolation channels;
    and wherein the second front end circuitry is adapted to decode two-state signals received by the second FS transceiver from the first FS transceiver over the one or more FS isolation channels for transmission at the second pair of terminals as signals corresponding to FS data and signaling.

3. The repeater of claim 1, wherein the first and second front end circuitry are adapted to encode signals received at the first and second pairs of terminals, respectively, and corresponding to a handshake sequence indicating entry into an HS operating mode, into two-state signals for transmission by the first and second FS transceivers, respectively, over one or more of the FS isolation channels;
    and wherein the first and second front end circuitry are adapted to decode two-state signals received over the one or more FS isolation channels for transmission at the first and second pairs of terminals, respectively, as signals in the handshake sequence;
    and wherein, in response to completion of the handshake sequence, the first and second front end circuitry enable the first and second HS transceivers, respectively, to drive and receive signals over the first and second HS isolation channels.

4. The repeater of claim 1, wherein each of the HS and FS isolation channels comprises one of a capacitive isolation channel, an inductive isolation channel, and an optical isolation channel.

5. The repeater of claim 1, wherein the first HS transceiver comprises:
    a transmitter having an input coupled to the first front end circuitry and an output coupled to the first HS isolation channel; and
    a receiver having an input coupled to the second HS isolation channel and an output coupled to the first front end circuitry;
    and wherein the second HS transceiver comprises:
    a transmitter having an input coupled to the second front end circuitry and an output coupled to the second HS isolation channel; and
    a receiver having an input coupled to the first HS isolation channel and an output coupled to the second front end circuitry.

6. The repeater of claim 1, wherein the first front end circuitry, the first HS transceiver, and the first FS transceiver are biased from a first power supply node and a first ground node;
    wherein the second front end circuitry, the second HS transceiver, and the second FS transceiver are biased from a second power supply node and a second ground node;
    wherein the first power supply node is electrically isolated from the second power supply node, and the first ground node is electrically isolated from the second ground node.

7. The repeater of claim 1, wherein the first front end circuitry comprises:
    a USB transceiver, coupled to the first pair of terminals;
    HS digital circuitry, coupled to the USB transceiver and to the first HS transceiver, and adapted to encode signals corresponding to HS data into two-state signals for transmission by the first HS transceiver; and
    USB digital circuitry, coupled to the USB transceiver and to the first FS transceiver, and adapted to encode signals corresponding to HS signaling into two-state signals for transmission by the first FS transceiver.

8. The repeater of claim 1, wherein the first front end circuitry further comprises:
    a squelch detector, coupled to the first pair of terminals, adapted to detect presence or absence of a signal at the first pair of terminals relative to one or more differential threshold levels.

9. The repeater of claim 8, wherein the first front end circuitry is adapted to encode two-state signals for transmission by the first HS transceiver and first FS transceiver at a start of a packet of HS data by performing a plurality of operations comprising:
responsive to the squelch detector detecting absence of a differential signal at the first pair of terminals, encoding a K state two-state signal for transmission by the first HS transceiver over the first HS isolation channel; and
then, responsive to the squelch detector detecting presence of a differential signal at the first pair of terminals and to the differential signal corresponding to a J state following a K state, encoding a J state two-state signal for transmission by the first HS transceiver over the first HS isolation channel;
wherein a sequence of K and J state pairs received at the first pair of terminals corresponds to a start-of packet indicator.

10. The repeater of claim 8, wherein the first front end circuitry is adapted to encode two-state signals for transmission by the first HS transceiver and first FS transceiver to indicate an end-of-packet for HS data transmission by:
responsive to the squelch detector detecting the absence of a signal, blocking the first HS transceiver from transmitting over the first HS isolation channel and encoding an end-of-packet signal for transmission by the first FS transceiver over one of the FS isolation channels; and
at the second FS transceiver, decoding the end-of-packet signal received on the FS isolation channel for transmission at the second pair of terminals as a single ended zero state.

11. The repeater of claim 1, wherein the first front end circuitry is adapted to encode signals received at the first pair of terminals and corresponding to HS data into single-ended signals transmitted by the first HS transceiver over the first HS isolation channel;
wherein the first front end circuitry is adapted to encode signals received at the first pair of terminals and corresponding to HS signaling into single-ended signals transmitted by the first FS transceiver over one or more of the FS isolation channels;
and wherein the second front end circuitry is adapted to decode single-ended signals received by the second FS transceiver from the first FS transceiver over the one or more FS isolation channels and from the first HS transceiver over the first HS isolation channel for transmission as signals at the second pair of terminals.

12. The repeater of claim 1, wherein the first front end circuitry is adapted to encode differential signals received at the first pair of terminals and corresponding to HS data into two-state signals transmitted by the first HS transceiver over the first HS isolation channel;
wherein the first front end circuitry is adapted to encode differential signals received at the first pair of terminals and corresponding to HS signaling into two-state signals transmitted by the first FS transceiver over one or more of the FS isolation channels;
and wherein the second front end circuitry is adapted to decode two-state signals received by the second FS transceiver from the first FS transceiver over the one or more FS isolation channels and from the first HS transceiver over the first HS isolation channel for transmission as differential signals at the second pair of terminals.

13. A method of communicating Universal Serial Bus (USB) signals corresponding to a high speed (HS) operating mode and a full speed (FS) operating mode across a galvanic isolation barrier, comprising:
receiving signals at a first pair of terminals of a repeater;
for received signals corresponding to data in the HS operating mode:
encoding the received signals corresponding to HS data into two-state signals;
transmitting only the two-state signals corresponding to the HS data across an isolation barrier over a first HS isolation channel;
decoding the two-state signals received from the first HS isolation channel into signals corresponding to HS data; and
transmitting the signals corresponding to HS data from a second pair of terminals of the repeater; and
for received signals corresponding to signaling in the HS operating mode:
encoding the received signals corresponding to HS signaling into two-state signals;
transmitting the two-state signals across the isolation barrier over one or more FS isolation channels;
decoding the two-state signals received from the one or more FS isolation channels into signals corresponding to HS signaling; and
transmitting the signals corresponding to HS signaling from the second pair of terminals of the repeater.

14. The method of claim 13, wherein the steps of transmitting two-state signals across the isolation barrier each comprise:
coupling the two-state signals to one side of a capacitive isolation barrier;
wherein the single ended signal is received at another side of the capacitive isolation barrier.

15. The method of claim 13, further comprising:
for received signals corresponding to data and signaling in the FS operating mode:
encoding the received signals into single ended signals;
transmitting the two-state signals across the isolation barrier over one or more FS isolation channels;
decoding the two-state signals received from the one or more isolation channels into signals corresponding to FS data and signaling; and
transmitting the signals corresponding to FS data and signaling from a second pair of terminals of the repeater.

16. The method of claim 13, further comprising:
for signals received at one of the first and second pairs of terminals of the repeater corresponding to a handshake sequence indicating entry into an HS operating mode:
encoding the received signals into single ended signals;
transmitting the two-state signals across the isolation barrier over the one or more FS isolation channels;
decoding the two-state signals received from the one or more isolation channels into signals corresponding to FS data and signaling;
transmitting the signals corresponding to FS data and signaling from another of the first and second pairs of terminals of the repeater; and
in response to completion of the handshake sequence, enabling first and second HS transceivers for driving and receiving single ended signals over first and second HS isolation channels.

17. The method of claim 13, further comprising:
for received signals corresponding to a start of a packet of data in the HS operating mode:
responsive to detecting absence of a signal at the first pair of terminals, encoding a K state two-state signal;
transmitting the K state two-state signal across the isolation barrier over the first HS isolation channel;

then, responsive to detecting presence of a signal at the first pair of terminals and to the signal corresponding to a J state following a K state, encoding a J state two-state signal;

transmitting the J state two-state signal over the first HS isolation channel;

wherein a sequence of K and J state pairs received at the first pair of terminals corresponds to a start-of packet indicator.

18. The method of claim 13, further comprising:

for received signals corresponding to an end of a packet of data in the HS operating mode:

responsive to receiving a signal at the first pair of terminals corresponding to an extended transmission of an opposite state from a previous state, encoding a two-state signal corresponding to the state of the extended transmission;

transmitting the two-state signal corresponding to the state of the extended transmission across the isolation barrier over the first HS isolation channel;

then, responsive to detecting absence of a signal at the first pair of terminals, blocking transmission of transitions of single ended signals over the first HS isolation channel and encoding a pulse for transmission by the first FS transceiver over one of the FS isolation channels; and decoding the pulse received on the first FS isolation channel as a single ended zero state; and transmitting a single ended zero state at the second pair of terminals.

19. The method of claim 13, wherein the two-state signals are single-ended signals.

20. The method of claim 13, wherein the signals received at the first pair of terminals of the repeater are differential signals;

and wherein, for received differential signals corresponding to data in the HS operating mode, the transmitting of signals corresponding to HS data from the second pair of terminals of the repeater comprises transmitting differential signals;

and wherein, for receive differential signals corresponding to signaling in the HS operation mode, the transmitting of signals corresponding to HS signaling from the second pair of terminals of the repeater comprises transmitting differential signals.

21. A universal serial bus (USB) repeater comprising:

a first front end coupled to a first input/output conductor (I/O), the first front end including:
a first USB transceiver coupled to the first I/O;
a first high-speed (HS) digital core coupled to the first USB transceiver;
a first USB digital core coupled to the first USB transceiver and the first HS digital core;
a first HS transceiver coupled to the first HS digital core; and
a first USB transceiver coupled to the first USB digital core;

a second front end coupled to a second I/O, the second front end including:
a second USB transceiver coupled to the second I/O;
a second high-speed (HS) digital core coupled to the second USB transceiver;
a second USB digital core coupled to the second USB transceiver and the second HS digital core;
a second HS transceiver coupled to the second HS digital core; and
a second USB transceiver coupled to the second USB digital core; and an isolation circuit isolatively coupled between the first front end and the second front end and having first and second isolation channels, wherein the first HS transceiver comprises:
a first transmitter having an input coupled to the first HS digital core and an output coupled to the first isolation channel; and
a first receiver having an input coupled to the second isolation channel and an output coupled to the first HS digital core;

and wherein the second HS transceiver comprises:
a second transmitter having an input coupled to the second HS digital core and an output coupled to the second isolation channel; and
a second receiver having an input coupled to the first isolation channel and an output coupled to the second HS digital core.

* * * * *